(12) United States Patent
Kim

(10) Patent No.: US 7,474,047 B2
(45) Date of Patent: Jan. 6, 2009

(54) ORGANIC EL DISPLAY AND FABRICATING METHOD THEREOF

(75) Inventor: Hong Gyu Kim, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 571 days.

(21) Appl. No.: 11/133,240

(22) Filed: May 20, 2005

(65) Prior Publication Data
US 2005/0258740 A1    Nov. 24, 2005

(30) Foreign Application Priority Data
May 21, 2004    (KR)    .................. 10-2004-0036349

(51) Int. Cl.
*H01J 1/62*    (2006.01)
*H01J 63/04*    (2006.01)
(52) U.S. Cl. ................. 313/504; 313/506; 445/23
(58) Field of Classification Search ................. 313/504, 313/506; 445/23
See application file for complete search history.

(56) References Cited

U.S. PATENT DOCUMENTS

2001/0041269 A1 * 11/2001 Berntsen et al. ............. 428/690

2004/0227698 A1 * 11/2004 Yamazaki et al. ............. 345/32

FOREIGN PATENT DOCUMENTS

| CN | 1765156 A | 4/2006 |
|---|---|---|
| EP | 1 337 131 A2 | 8/2003 |
| JP | 2002-246185 | 8/2002 |
| JP | 2004-111356 | 4/2004 |

* cited by examiner

*Primary Examiner*—Nimeshkumar D Patel
*Assistant Examiner*—Thomas A Hollweg
(74) *Attorney, Agent, or Firm*—Holland & Knight LLP

(57) ABSTRACT

An organic EL display and fabricating method thereof are disclosed. The present invention includes a transparent substrate having a plurality of pixel areas wherein each of a plurality of the pixel areas is divided into a first area and a second area, a first organic EL device on the first area of the transparent substrate to emit light to a bottom of the transparent substrate, and a second organic EL device on the second area of the transparent substrate to emit light to a top of the transparent substrate.

10 Claims, 10 Drawing Sheets

ORGANIC EL DISPLAY AND FABRICATING METHOD THEREOF

This application claims the benefit of the Korean Patent Application No. 10-2004-0036349, filed on May 21, 2004, which is hereby incorporated by reference as if fully set forth herein.

BACKGROUND OF THE INVENTION

1. Field of the Invention

The present invention relates to an organic EL display and fabricating method thereof. Although the present invention is suitable for a wide scope of applications, it is particularly suitable for two-side emissions.

2. Discussion of the Related Art

Generally, a pixel area of an organic EL display consists of a switching thin film transistor for switching a pixel a drive thin film transistor for driving the pixel, a storage capacitor, an anode (pixel electrode), an organic emitting layer, and a cathode (common electrode).

FIG. 1 is a diagram of circuit for an organic EL display according to a related art, FIG. 2 is a layout of an organic EL display according to a related art, and FIG. 3 is a cross-sectional diagram taken along a cutting line I-I in FIG. 2.

Referring to FIGS. 1 to 3, a semiconductor layer 2 is formed on a glass substrate 1 with polysilicon and the like. The semiconductor layer 2 is then patterned to leave an area for forming a thin film transistor therein.

A gate insulating layer 3 and a gate electrode conductive layer are sequentially formed over the substrate 1. The gate electrode conductive layer is then patterned to form a gate electrode 4.

Source and drain regions 2a and 2c of a thin film transistor are formed by implanting dopants in the semiconductor layer 2 with B, P or the like using the gate clectrode 4 as an implantation mask and performing thermal treatment on the dopant-implanted semiconductor layer 2.

In this case, an undoped portion of the semiconductor layer 2 becomes a channel region 2b.

Subsequently, an insulating interlayer 5 is formed over the substrate 1. The insulating interlayer 5 and the gate insulating layer 3 are then selectively removed to expose the source drain regions 2a and 2c of the thin film transistor.

An electrode line 6 is formed to be electrically connected to each of the exposed source and drain regions 2a and 2b.

A planarizing insulating layer 7 is formed over the substrate. The planarizing insulating layer 7 is then selectively removed to expose the electrode line 6 connected to the drain region 2c.

An anode (pixel electrode) 8 is formed to be electrically connected to the exposed electrode line 6.

Subsequently, an insulating layer 9 is formed between neighboring anodes 8.

And, a hole injection layer 10, a hole transport layer 11, an organic emitting layer, an electron transport layer 13 and an electron injection layer 14 are sequentially formed over the substrate.

After a cathode (common electrode) 15 of aluminum or the like has been formed over the substrate, a passivation layer 16 is formed on the cathode 15 to cut off oxygen or moisture.

However, in the above-fabricated related art organic EL display, the drive circuit occupies most parts of the pixel area to reduce a portion, through which the light can pass, i.e., to lower an aperture ratio.

Moreover, in case of employing a compensation circuit, the area occupied by the drive circuit in each pixel area is increased more to lower the aperture ratio considerably.

SUMMARY OF THE INVENTION

Accordingly, the present invention is directed to an organic EL display and fabricating method thereof that substantially obviate one or more problems due to limitations and disadvantages of the related art.

An object of the present invention is to provide an organic EL display and fabricating method thereof, in which light is emitted from a pixel area having a drive circuit formed thereon and by which a aperture ratio can be raised.

Another object of the present invention is to provide an organic EL display and fabricating method thereof, in which light can be emitted from front and rear sides of one substrate to enable two-way viewings.

Another object of the present invention is to provide an organic EL display and fabricating method thereof, in which a pair of organic EL displays are simultaneously fabricated on one substrate, by which a corresponding process is simplified, and by which a processing cost is lowered.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic EL display according to the present invention includes a transparent substrate having a plurality of pixel areas wherein each of a plurality of the pixel areas is divided into a first area and a second area, a first organic EL device on the first area of the transparent substrate to emit light to a bottom of the transparent substrate, and a second organic EL device on the second area of the transparent substrate to emit light to a top of the transparent substrate.

Preferably, a transistor for driving the first and second organic EL devices is formed in the second area.

Preferably, the first and second organic EL devices are electrically connected to a same transistor to be driven.

Preferably, the first organic EL device includes a transistor formed in the second area of the transparent substrate, a first anode formed in the first and second areas of the transparent substrate to be electrically connected to the transistor, an organic EL layer formed on the first anode, and a first cathode formed on the organic EL layer in the first area of the transparent substrate.

More preferably, the first anode is a transparent electrode having a high work function and the first cathode is a metal electrode having high reflectivity.

Preferably, the second organic EL device includes a transistor formed in the second area of the transparent substrate, a second anode formed in the second area of the transparent substrate to be electrically connected to the transistor, an organic EL layer formed on the second anode, and a second cathode formed on the organic EL layer in the second area of the transparent substrate.

More preferably, the second anode is a metal electrode having high reflectivity and low work function and the second cathode is a thin metal electrode having transmittance.

In another aspect of the present invention, an organic EL display includes a transparent substrate having a plurality of pixel areas wherein each of a plurality of the pixel areas is divided into a first area and a second area, a transistor formed in the second area of the transparent substrate, a first anode formed in the first and second areas of the transparent substrate including the second anode, an organic EL layer formed on the first anode, a first cathode formed on the organic EL layer in the first area of the transparent substrate, and a second anode formed on the organic EL layer in the second area of the transparent substrate.

In another aspect of the present invention, a method of fabricating an organic EL display includes the steps of preparing a transparent substrate having a plurality of pixel areas wherein each of a plurality of the pixel areas is divided into a first area and a second area, forming a transistor on the second area of the pixel area of the transparent substrate, forming a first insulating layer on the transparent substrate including the transistor, exposing an electrode of the transistor by removing a predetermined portion of the first insulating layer, forming a second anode on the first insulating layer in the second area of the pixel area to be electrically connected to the exposed electrode of the transistor, forming a first anode on the first insulating layer including the second anode in the first and second areas of the pixel area, forming an organic EL layer over the substrate including the first anode, forming a first cathode on the organic EL layer in the first area of the pixel area, and forming a second cathode on the organic EL layer in the second area of the pixel area.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

The concept of the present invention lies in that a top emission type organic EL device is implemented one more using an area occupied by a drive circuit in a pixel area Namely, a bottom emission type organic EL device is implemented in an emitting area of a pixel area and a top emission type organic EL device is implemented in a drive circuit area of the pixel area, simultaneously. Hence, the present invention enables the devices to be independently driven.

Figure 1:
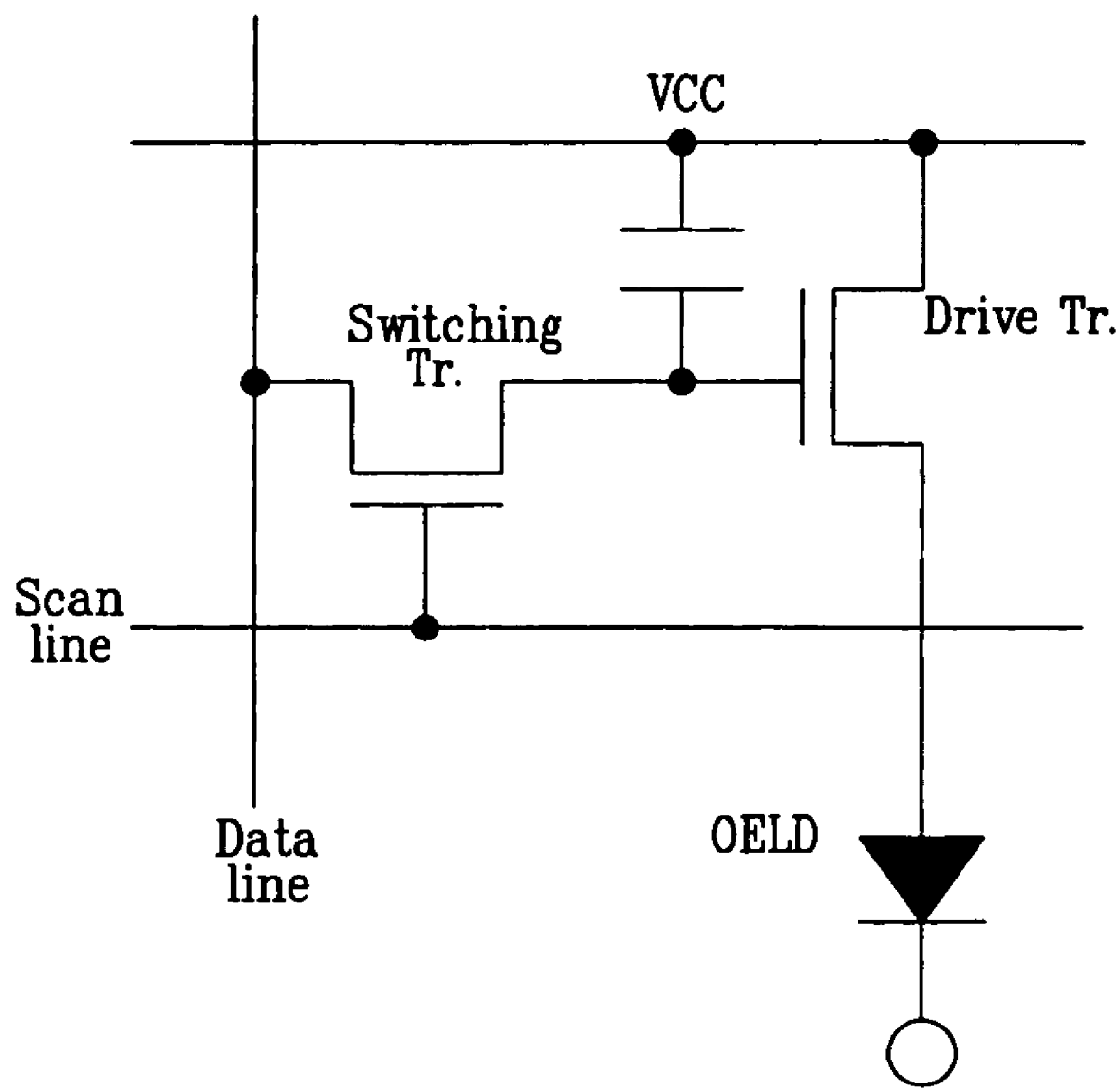
FIG. 1 is a diagram of circuit for an organic EL display according to a related art.
Figure 2:
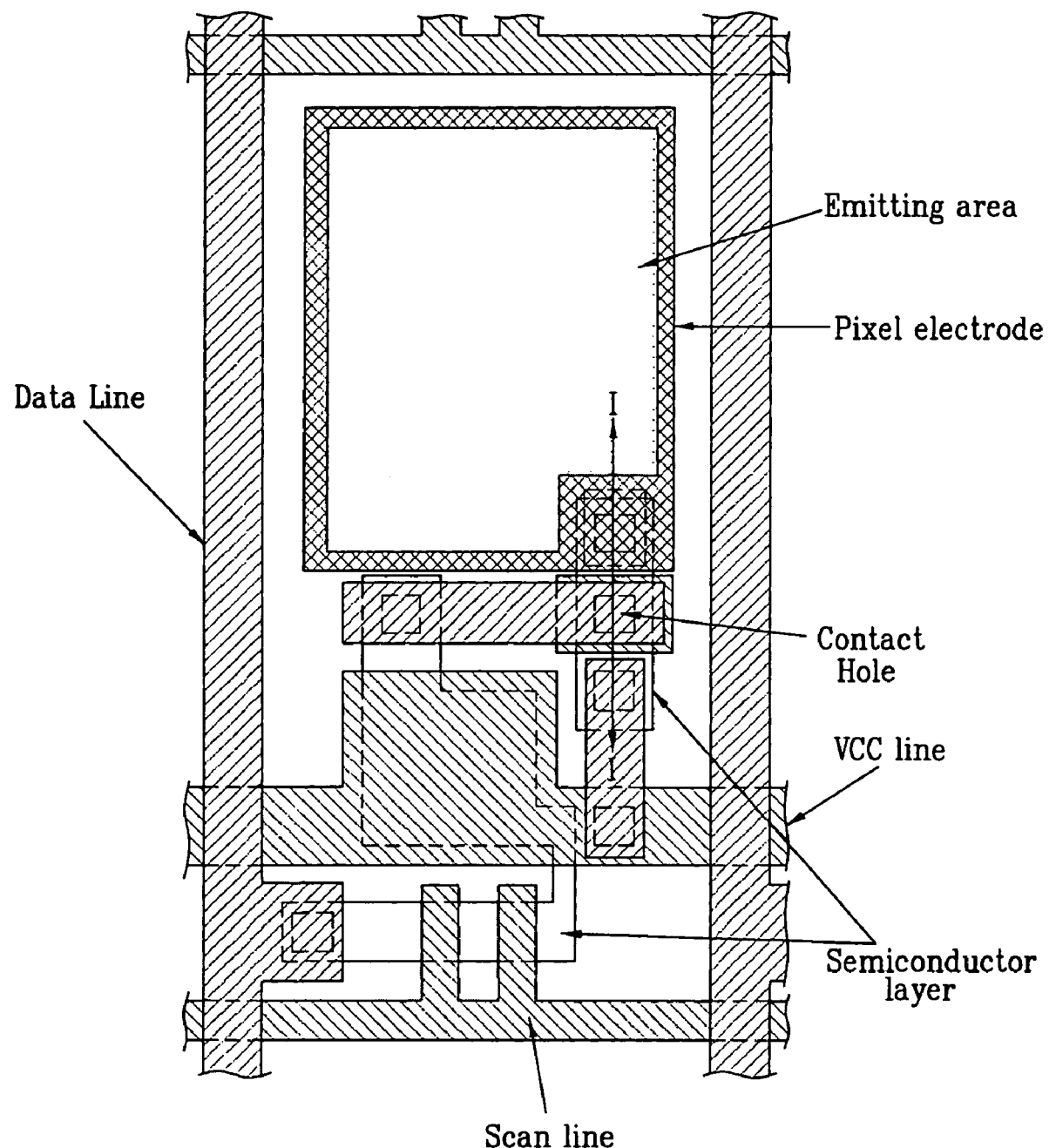
FIG. 2 is a layout of an organic EL display according to a related art.
Figure 3:
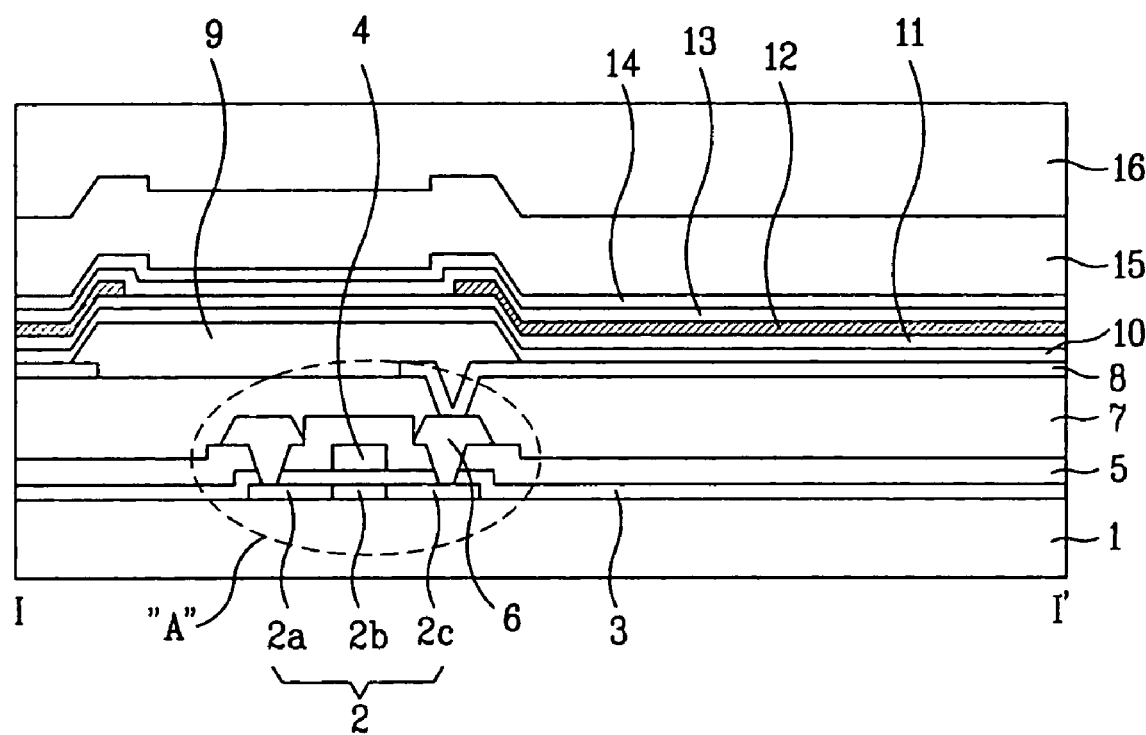
FIG. 3 is a cross-sectional diagram taken along a cutting line I-I in FIG. 2.
Figure 4:
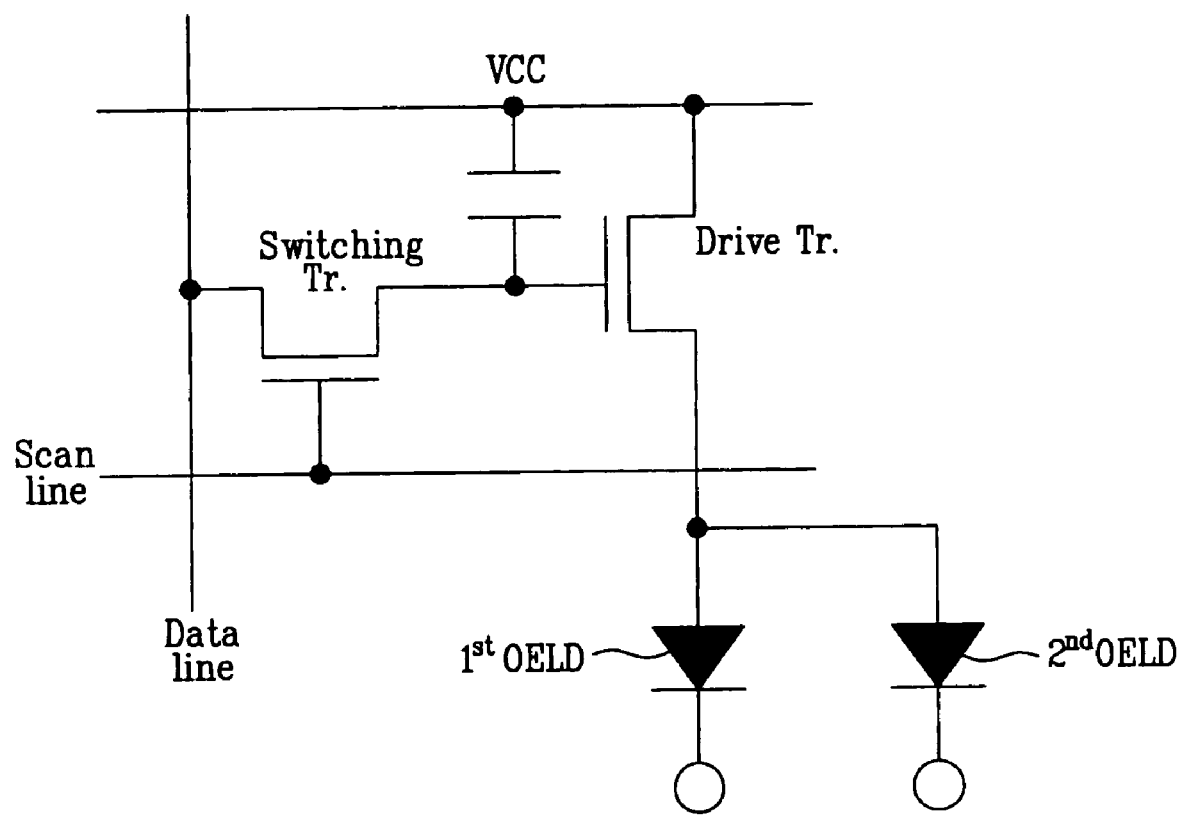
FIG. 4 is a diagram of circuit for an organic EL display according to the present invention.
Figure 5:
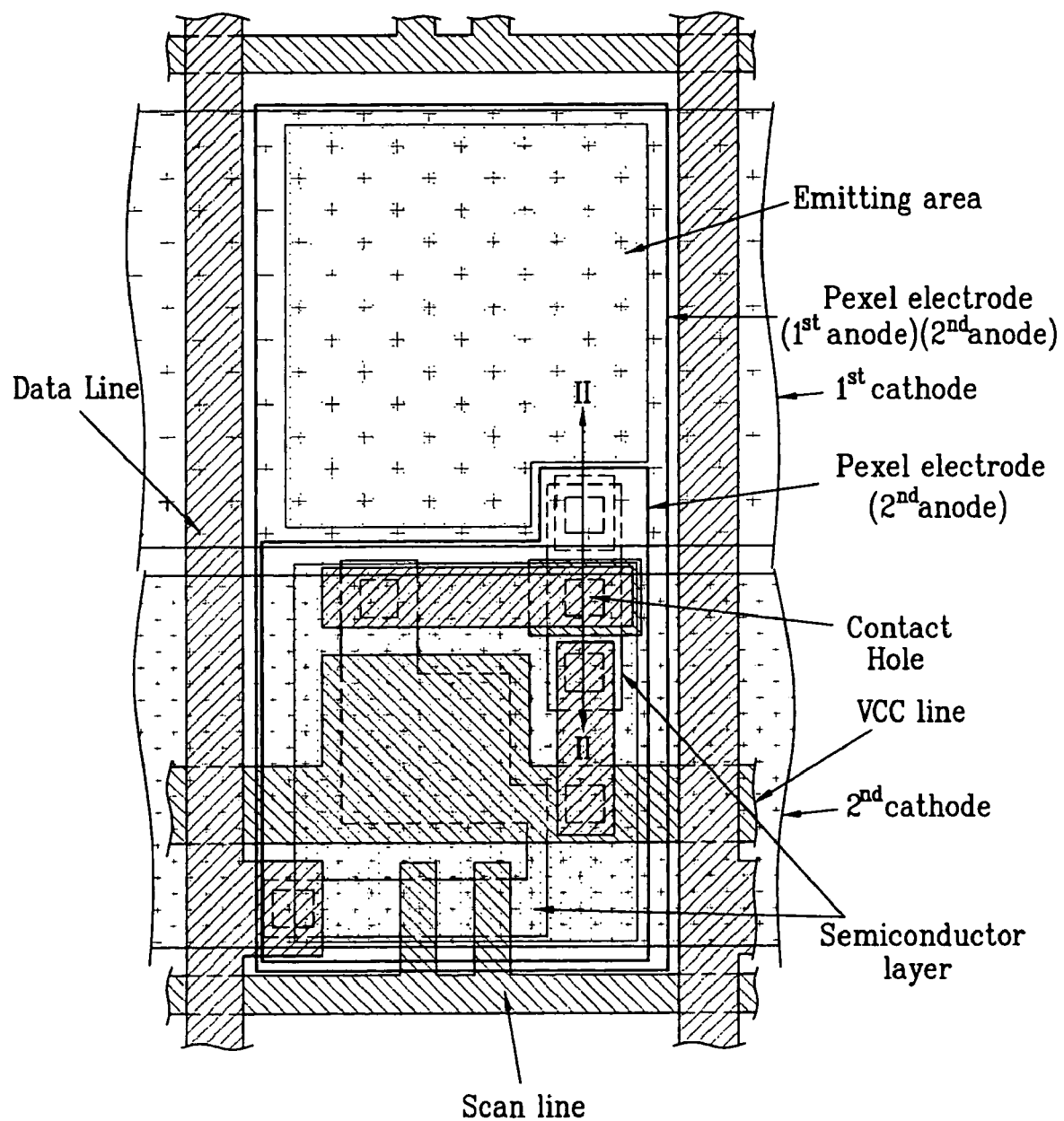
FIG. 5 is a layout of an organic EL display according to the present invention.

FIG. 4 is a diagram of circuit for an organic EL display according to the present invention, FIG. 5 is a layout of an organic EL display according to the present invention, and FIGS. 6A to 6I are cross-sectional diagrams taken along a cutting line II-II in FIG. 5.

Referring to FIG. 4 and FIG. 5, a pixel area of the present invention includes a switching thin film transistor for switching a pixel a driving thin film transistor for driving the pixel, a storage capacitor, a first anode (pixel electrode), a second anode (pixel electrode), an organic emitting layer, a first cathode (common electrode) and a second cathode (common electrode).

A transparent substrate of the present invention includes a plurality of pixel areas. Each of a plurality of the pixel areas is divided into a first area and a second area.

In this case, the first area is an emitting area and the second area is a drive circuit area.

The present invention intends to fabricate the second area, i.e., the drive circuit area into another emitting area.

Hence, a first organic EL device is formed in the first area of the pixel area to emit light to a bottom of the transparent substrate and a second organic EL device is formed in the second area of the pixel area to emit light to a top of the transparent substrate.

In this case, a transistor for driving the first and second organic EL devices is formed in the second area.

And, the first organic EL device and the second organic EL device can be electrically connected to the same transistor to be driven. Alternatively, the first and second organic EL devices can be electrically connected to different transistors, respectively.

The first organic EL device includes the first anode (pixel electrode), an organic EL layer and the first cathode.

In this case, the first anode is formed across the first and second areas of the pixel area to be electrically connected to the transistor. The organic EL layer is formed on the first anode. The first cathode is formed on the organic EL layer to be formed in the first area of the pixel area.

In this case, the first anode is a transparent electrode formed of ITO or the like to have a high work function. The first cathode is formed of a conductive metal electrode having high reflectivity and low work function such as an AL electrode and the like.

The second organic EL device includes the second anode (pixel electrode), an organic EL layer and the second cathode.

In this case, the second anode is in the second area of the pixel area to be electrically connected to the transistor. The organic EL layer is formed on the second anode. The second cathode is formed on the organic EL layer to be formed in the second area of the pixel area.

In this case, the second anode is a metal electrode having high reflectivity like Al, Cr, Ag and the like. The second cathode is formed of a thin metal electrode having transmittance.

In this case, the second cathode 38 can be formed by depositing Al 1~10 nm thick and depositing Ag 1~15 nm thick on the Al, by depositing alloy of Mg:Ag or the like 1~15 nm thick or by using a conductive material having low conductivity.

A fabricating process of the above-configured organic EL display according to the present invention is explained as follows.

FIGS. 6A to 6I are process cross-sectional diagrams taken along a cutting line II-II in FIG. 5.

Figure 6A:
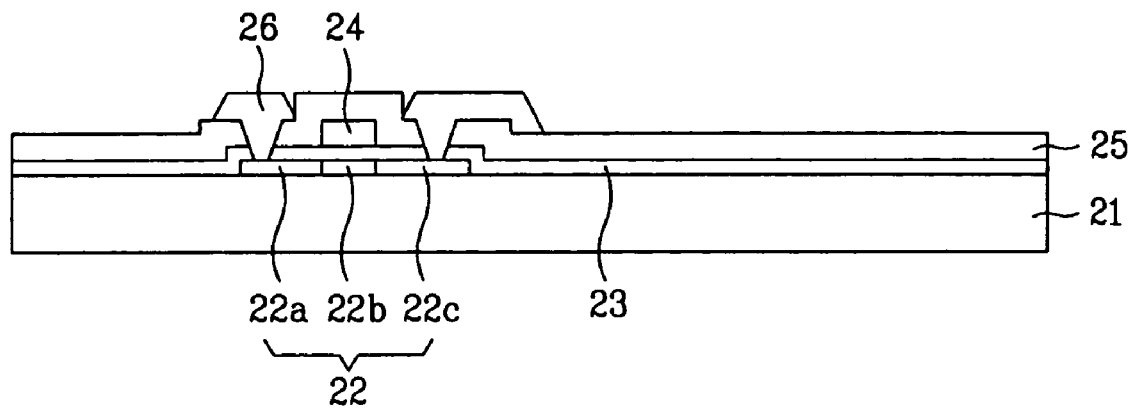
FIGS. 6A to 6I are cross-sectional diagrams taken along a cutting line II-II in FIG. 5.

Referring to FIG. 6A, a transparent substrate having a plurality of pixel areas each of which is divided into a first area (emitting area) and a second area (drive circuit area).

A semiconductor layer 22 is formed on the second area of the transparent substrate 21 using polysilicon and the like to be utilized as an active layer of a thin film transistor.

After a gate insulating layer 23 has been formed on the transparent substrate 21 including the semiconductor layer 22, a gate electrode 24 is formed on the gate insulating layer 23.

Subsequently, impurities or dopants are implanted into the semiconductor layer 22 using the gate electrode 24 as an implantation mask and are then annealed to form a source region 22a and a drain region 22c of the thin film transistor.

An insulating interlayer 25 is formed on an entire surface of the transparent substrate 21 including the gate electrode 24 and is then patterned to expose portions of the source and drain regions 22a and 22c, respectively.

Thereafter, electrodes are formed to be electrically connected to the source and drain regions 22a and 22c, respectively to complete the thin film transistor.

Figure 6B:
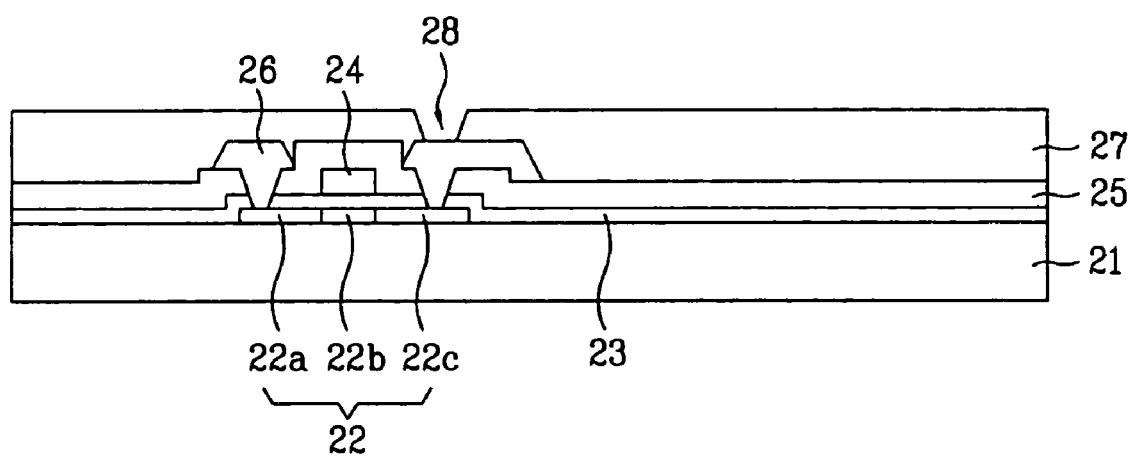

Referring to FIG. 6B, a planarizing layer 27 is formed over the substrate to planarize a surface over the substrate using an insulator. The planarizing layer 27 is patterned to form a contact hole 28 exposing a portion of the electrode 26 of the drain region 22c.

Figure 6C:
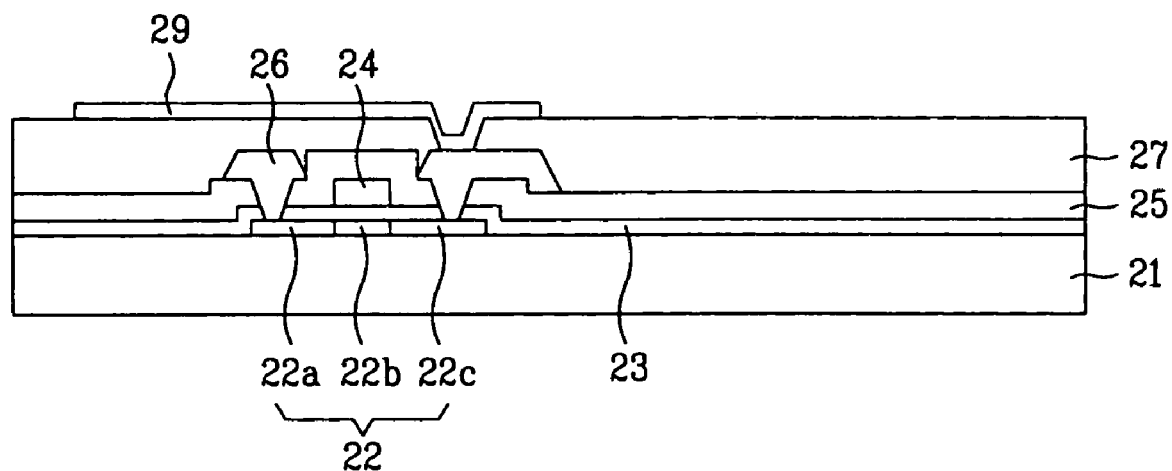

Referring to FIG. 6C, a conductive substance having high reflectivity such a Cr, Al, Ag and the like on the planarizing layer 27 in the second area of the pixel area and is then patterned to form a second anode 29 for top emission.

Figure 6D:
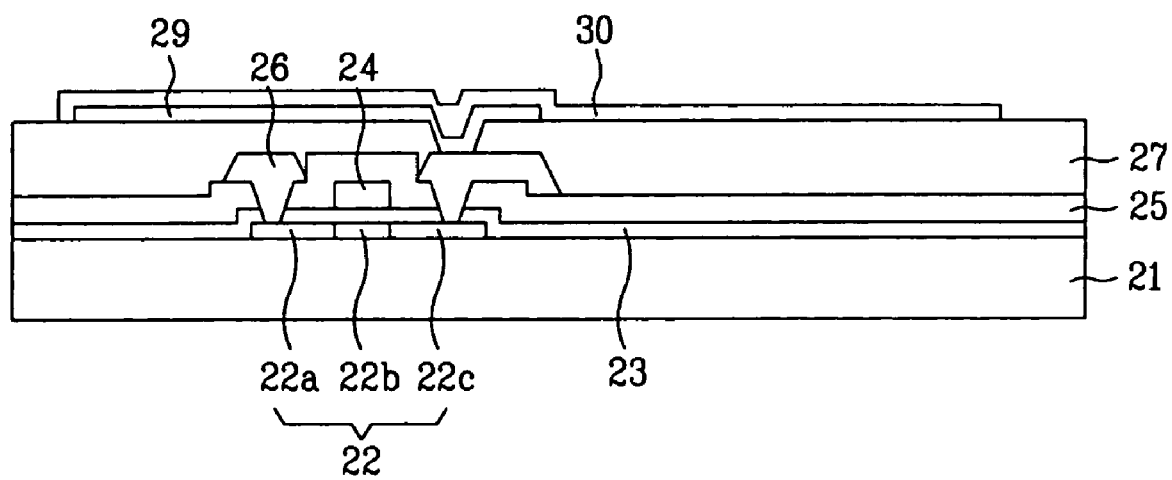

Referring to FIG. 6D, a transparent conductive substance having a high work function value such as ITO, IZO and the like is formed on the planarizing layer 27 including the second anode 29 and is then patterned to form a first anode 30 for bottom emission.

In this case, the first anode 30 is formed in the first and second areas of the pixel area.

Figure 6E:
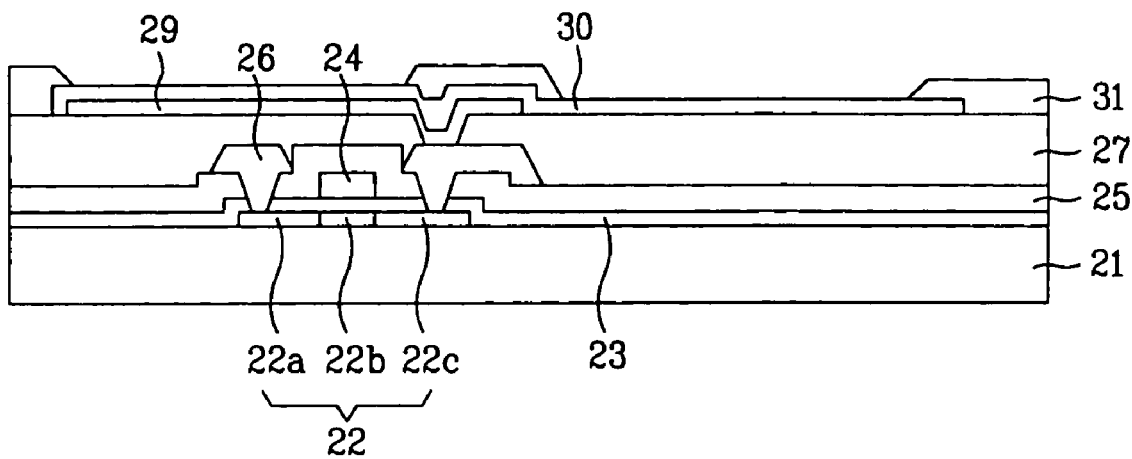

Referring to FIG. 6E, an insulating layer 31 is formed over the substrate and is then patterned to remain on an electrical connection area between the second anode 29 and the electrode 26 and on edge areas of the first and second anodes 30 and 29 only.

Figure 6F:
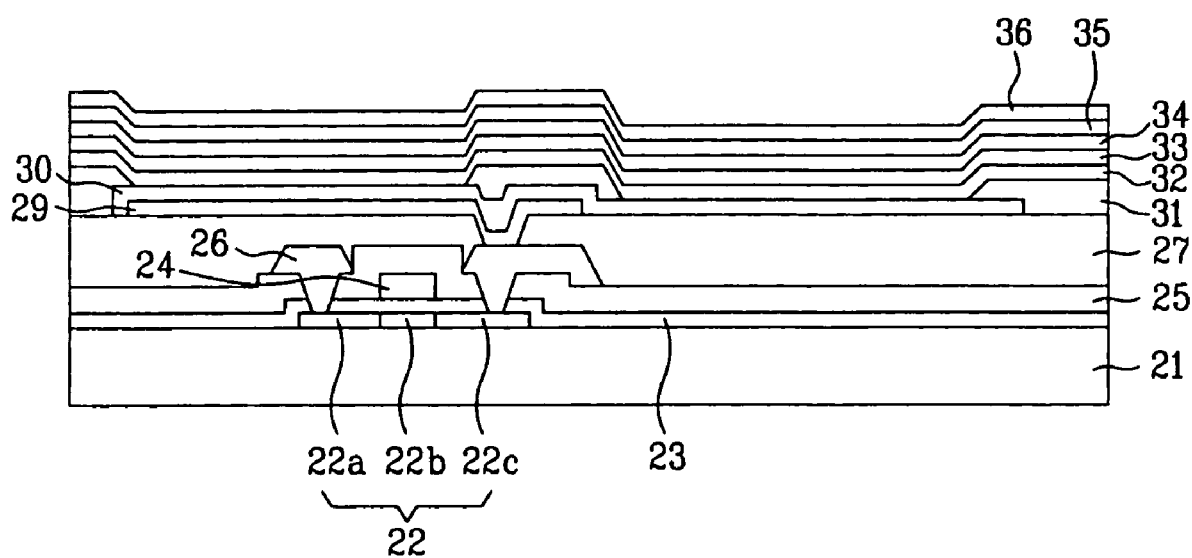

Referring to FIG. 6F, a hole injection layer 32, a hole transport layer 33, an organic emitting layer 34, an electron transport layer 35 and an electron injection layer 36 are sequentially formed on the first anode 30 to form an organic EL layer.

Figure 6G:
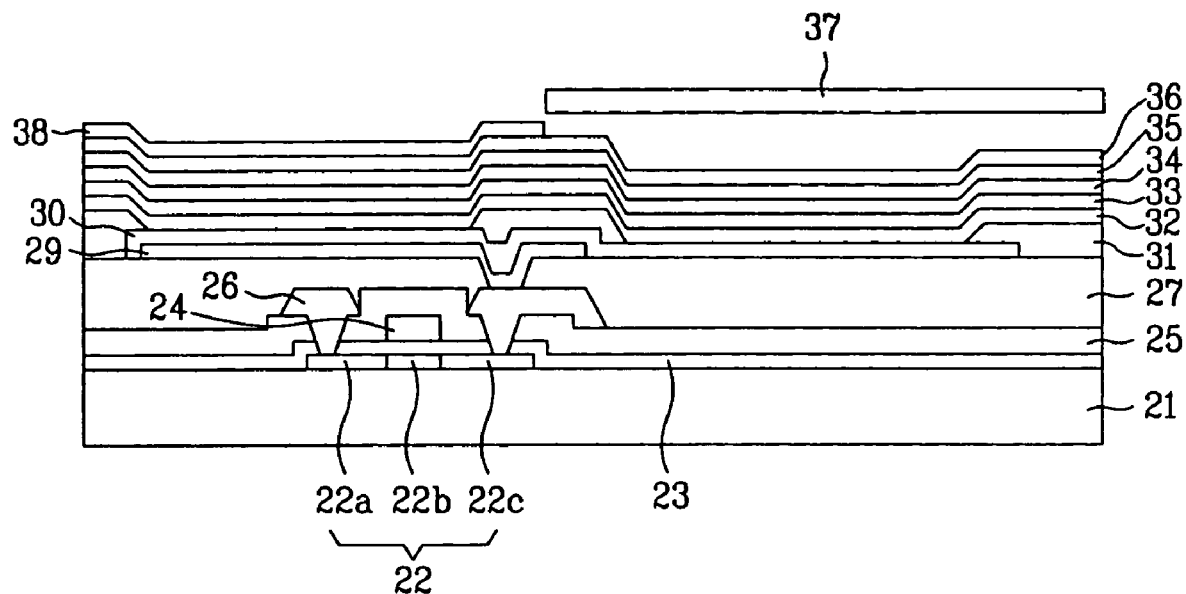

Referring to FIG. 6G, a second cathode 38 for top emission is formed on the electron injection layer 36 in the second area of the pixel area using a first shadow mask 37.

In this case, the second cathode 38 is a thin metal electrode and can be formed by depositing Al 1~10 nm thick and depositing Ag 1~15 nm thick on the Al, by depositing alloy of Mg:Ag or the like 1~15 nm thick or by using a conductive material having low conductivity.

Figure 6H:
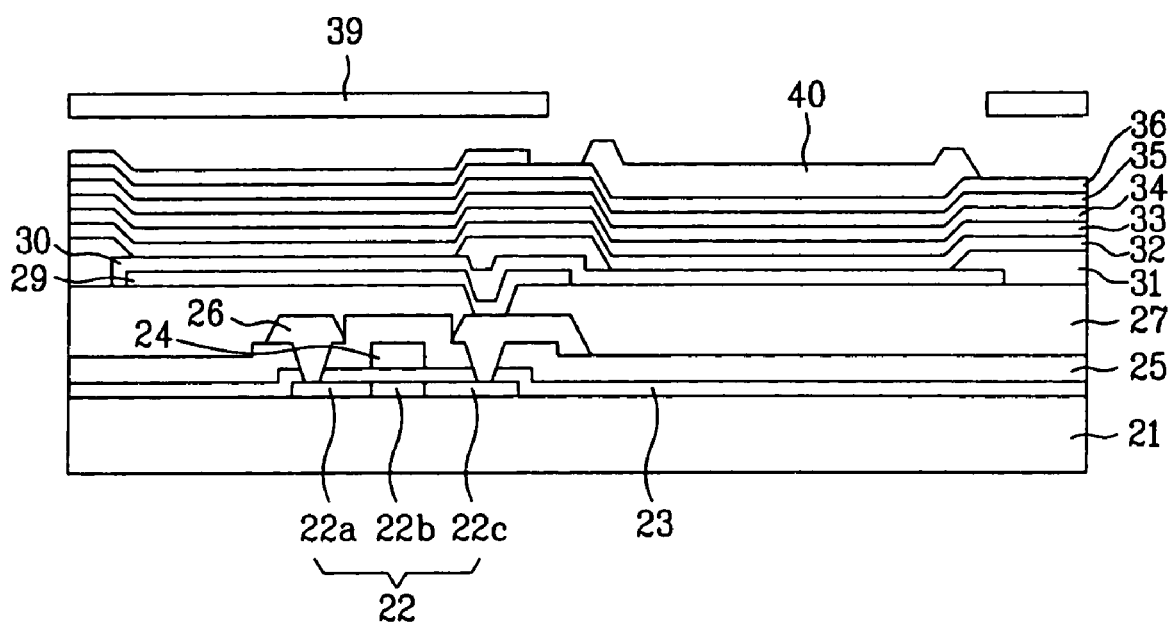

Referring to FIG. 6H, a first cathode 40 for bottom emission is formed on the electron injection layer 36 in the first area of the pixel area using a second shadow mask 37.

In this case, the first cathode 40 is formed of a conductive material having high reflectivity and low work function such as Al.

Figure 6I:
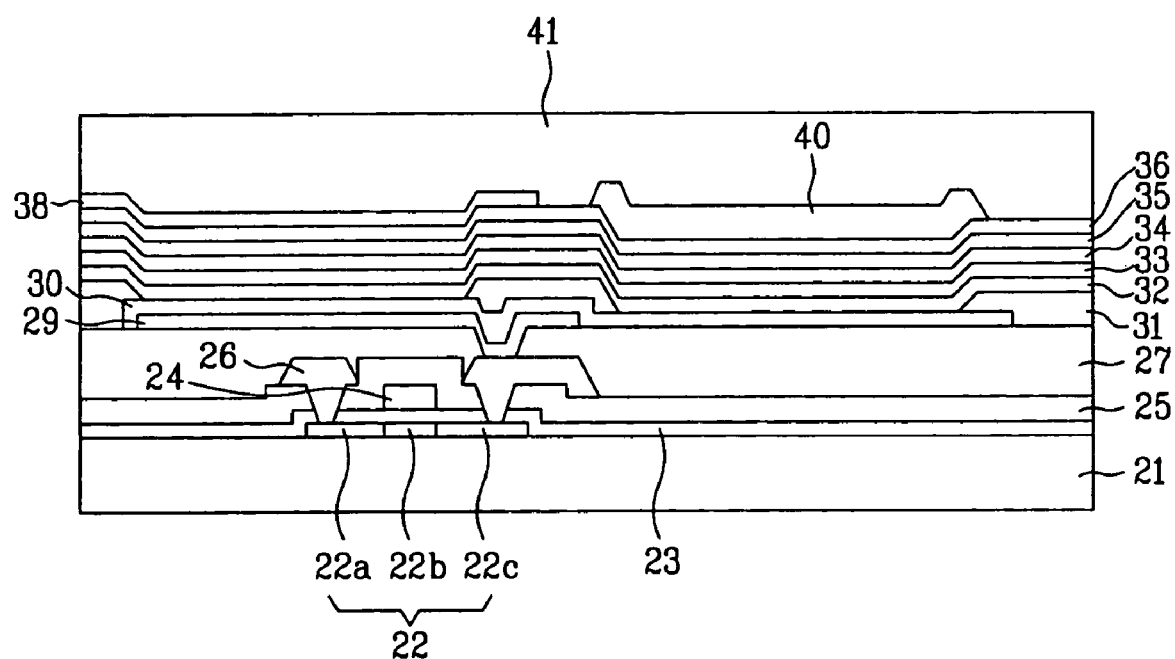

Referring to FIG. 6I, a passivation layer 41 is formed over the substrate to cut of penetration of oxygen or moisture into the organic EL layer. And, a protective cap (not shown in the drawing) is put thereon.

Accordingly, the present invention provides the following advantages or effects.

First of all, since the anode surfaces of the top emission type organic EL device and the bottom emission type organic EL device are formed of the transparent conductive substance such as ITO, IZO and the like, the present invention simplifies the corresponding process to enhance mass productivity and device characteristics.

Secondly, as the first cathode 40 for the top emission is separated from the second cathode 38 for bottom emission, the independent drives of the first and second organic EL devices are enabled.

Thirdly, since both of the bottom emission and the top emission are simultaneously implemented using the same drive transistor, the present invention enables the fabrication of the display of new concept that enables users to view image from both sides and raises the economical value of the device.

Fourthly, in case of applying the organic EL display according to the present invention to a mobile terminal, the present invention enables the implementation of an external display and an internal display using one display module to enable the development of a mobile phone or terminal of low price.

Fifthly, the present invention uses the related art process conditions to simplify the fabricating process, thereby enhancing mass productivity.

Sixthly, as the cathode electrode for the top emission is separated from the cathode for the bottom emission, the present invention enables independent drives of the first and second organic EL devices. Therefore, the present invention can drive the bottom emission and the top emission simultaneously or independently.

Finally, in case of applying the above-function to a mobile terminal, the present invention enables the implementations of displays for internal and external windows using one display module only.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic EL display comprising: a transparent substrate having a plurality of pixel areas wherein each of a plurality of the pixel areas is divided into a first area and a second area; a transistor formed in the second area of the transparent substrate; a second anode formed in the only second area of the transparent substrate to be directly and electrically connected to the transistor; a first anode formed in the first and second areas of the transparent substrate wherein the first anode is on the second anode; an organic EL layer formed on the first anode; a first cathode formed on the organic EL layer in the first area of the transparent substrate, wherein the first cathode is formed on a region excluding the second anode; and a second cathode formed on the organic EL layer in the second area of the transparent substrate.

2. The organic EL display of claim 1, wherein the first anode is a transparent electrode having a high work function and wherein the first cathode is a metal electrode having high reflectivity.

3. The organic EL display of claim 1, wherein the second anode is a metal electrode having high reflectivity and low work function and wherein the second cathode is a thin metal electrode having transmittance.

4. The organic EL display of claim 1, wherein an insulating layer is formed on an electrically connecting area between the transistor and each of the first and second anodes and on edge areas of the first and second anodes.

5. A method of fabricating an organic EL display, comprising the steps of: preparing a transparent substrate having a plurality of pixel areas wherein each of a plurality of the pixel areas is divided into a first area and a second area; forming a transistor on the second area of the pixel area of the transparent substrate; forming a first insulating layer on the transparent substrate including the transistor; exposing an electrode of the transistor by removing a predetermined portion of the first insulating layer; forming a second anode on the first insulating layer in the only second area of the pixel area to be directly and electrically connected to the exposed electrode of the transistor; forming a first anode on the first insulating layer including the second anode in the first and second areas of the pixel area; forming an organic EL layer over the substrate including the first anode; forming a first cathode on the organic EL layer in a region excluding the second anode; and forming a second cathode on the organic EL layer in the second area of the pixel area.

6. The method of claim 5, wherein in the step of forming the first anode, the first anode is formed of a transparent electrode having a high work function and wherein in the step of forming the second anode, the second anode is formed of a metal electrode having high reflectivity.

7. The method of claim 5, wherein in the step of forming the first cathode, the first cathode is formed of a metal electrode having high reflectivity and low work function and wherein in the step of forming the second cathode, the second cathode is formed of a thin metal electrode having transmittance.

8. The method of claim 7, wherein the second cathode is formed by depositing Al 1~10 nm thick and depositing Ag 1~15 nm thick on the Al, by depositing alloy of Mg:Ag or the like 1~15 nm thick or by using a conductive material having low conductivity.

9. The method of claim 5, further comprising a step of forming a second insulating layer on an area connecting the second anode to the transistor electrically and on edge areas of the first and second anodes.

10. The method of claim 5, the organic EL layer forming step comprising the steps of:
    forming a hole injection layer over the substrate including the first anode;
    forming a hole transport layer on the hole injection layer;
    forming an emitting layer on the hole transport layer;
    forming an electron transport layer on the emitting layer; and
    forming an electron injection layer on the electron transport layer.

* * * * *